United States Patent [19]
Mason et al.

[11] Patent Number: 5,299,158
[45] Date of Patent: Mar. 29, 1994

[54] MEMORY DEVICE WITH MULTIPLE READ PORTS

[75] Inventors: Russell W. Mason; Jeffry D. Yetter, both of Ft. Collins, Colo.

[73] Assignee: Hewlett-Packard Company, Palo Alto, Calif.

[21] Appl. No.: 899,207

[22] Filed: Jun. 16, 1992

[51] Int. Cl.$^5$ .............................. G11C 11/34
[52] U.S. Cl. .................. 365/189.04; 365/230.05; 365/230.08; 365/189.05
[58] Field of Search ............ 365/189.04, 230.05, 365/230.08, 189.05

[56] References Cited

FOREIGN PATENT DOCUMENTS 59-22290  2/1984  Japan .
62-285296 12/1987  Japan .

OTHER PUBLICATIONS

"Port-Multiplexed Register File", IBM TDB, vol. 27, No. 5, Apr. 1985, pp. 6570-6571.
DeLano et al., "A High Speed Superscalar PA-RISK Processor" Proceedings of the Compcon Spring 1992, Digest of papers, San Francisco, Calif.; Feb. 24-28, 1992.

Primary Examiner—Eugene R. LaRoche
Assistant Examiner—Viet Q. Nguyen
Attorney, Agent, or Firm—Guy J. Kelley

[57] ABSTRACT

A memory device having a plurality of read ports which can be dumped simultaneously without affecting the data stored in the memory cells of the memory device. The read ports of the memory device of the invention include dump circuits comprising a pair of small NFETs which logically AND the values stored in the memory cell with a READ input signal and then pull low a precharged output line only when both of these signals are true. Each such read port dump circuit is electrically isolated from the others so that multiple read ports can be dumped simultaneously with affecting the data stored in the memory device. Also, by placing only a single transistor in the read port discharge path, the dump circuit may be small and have a minimal impact on write setup time in accordance with the invention.

4 Claims, 6 Drawing Sheets

MEMORY DEVICE WITH MULTIPLE READ PORTS

BACKGROUND OF THE INVENTION

1. Field of the Invention

The present invention relates to a memory device having a plurality of read ports, and more particularly, to a memory device which can drive multiple read ports simultaneously without affecting the data stored therein.

2. Description of the Prior Art

FIG. 1 illustrates a floating point data path of a conventional floating point processor. As illustrated, the floating point data path includes a register file 100 comprising a plurality of registers for storing input data such as operands received from the processor's data cache, operand alignment circuits 102 and 104, and floating point processors such as floating point ALU (FALU) 106, floating point multiplier (FMULT) 108 and floating point divide/square root circuit 110. Typically, the floating point multiply, divide, add and load or store functions are performed by sequentially executing separate instructions (i.e., only one add or one multiply is performed at a time). Recently, however, floating point processors have been designed to allow concurrent execution of the floating point multiply, divide, add and load or store instructions, thereby significantly increasing the processing efficiency of the floating point processor. For such floating point processors it has become desirable that the register file 100 have a plurality of read ports and a plurality of write ports to facilitate the concurrent processing.

DeLano et al. describe in an article entitled "A High Speed Superscalar PA-RISC Processor", *Proceedings of the Compcon Spring* 1992, *Digest of Papers*, San Francisco, Calif., Feb. 24-28, 1992, a floating point processor comprising such a floating point data path. The register file 100 of DeLano et al.'s floating point processor has 32 64-bit registers (4 registers are reserved for floating point exception data) and 5 read ports and 3 write ports to allow concurrent execution of a multiply, an add and a load or store. It was the goal of the present inventors to design a register file 100 for such a floating point processor which can dump stored data to five or more read ports simultaneously without disturbing the state of the register file as a result of the capacitance on the output lines.

In designing such a register cell, it is desirable that the speed of the circuit be maximized while the chip area of the register cell is minimized. If the register file 100 is small, the individual RAM cells (which may comprise simple cross-coupled inverters) of the register file 100 may be made large and powerful. However, as the number of RAM cells and the number of read ports increases, the speed of the cell decreases as the cost of the RAM cells increases. For example, if there are 2,048 RAM cells in the register file 100, and each RAM cell has 5 read ports, the size of the read port dominates the size of the RAM cell. It has thus been desirable to design the read ports so that they are small, have a sufficiently small output delay, and are capable of dumping multiple read ports simultaneously without disturbing the contents of the RAM cell. It has also been desirable for the read ports to present a small capacitive load to the RAM cell so that the setup time of the write ports (which may comprise simple transfer gates) is not degraded. The known memory cells do not meet these needs.

For example, a register cell 100 having the simplest form of a read port for the RAM cell has a transfer gate as illustrated in FIG. 2. As shown, each write port of the register cell 100 consists of a simple transfer gate (200, 202 or 204) which receives an input (ina, inb, inc) from, for example, FALU 106, FMULT 108 or from the data cache and transfers the respective inputs to node N1 when their corresponding WRITE signals (wra, wrb, wrc) from a write address decoder are high. The respective inputs are then stored in RAM cell 206. As shown, each RAM cell 206 typically comprises cross-coupled inverters comprised of PFETs 208 and 212 and NFETs 210 and 214. The output of the RAM cell 206 may then be output to the appropriate output line (OUT1, OUT2, OUT3) via respective transfer gates 216, 218 or 220 in response to a READ signal (READ1, READ2, READ3).

In the configuration of FIG. 2, the weak inverters of the RAM cell 206 must drive the relatively large capacitance of each of the output ports simultaneously. However, the inverters of the RAM cell 206 typically do not have enough current capability to drive multiple output ports simultaneously. In addition, since charge sharing from output busses can upset the values stored in the RAM cell 206, such a configuration is generally unsuitable for use with multiple read ports. For example, the capacitance on the output bus could drive a value to the RAM cell 206 unless PFETs 208 and 212 are large enough to drive all outputs simultaneously. For this reason, in order for the RAM cell 206 to drive multiple read ports, the inverters of the RAM cell 206 must be relatively large and thus take up a relatively large area on the chip substrate.

FIG. 3 illustrates a register cell 100 similar to that illustrated in FIG. 2 except that an output inverter is disposed between the RAM cell 206 and each output port so as to render the register cell 100 suitable for use with a small number of read ports by decoupling the RAM cell 206 from the outputs. Generally, this inverter (transistors 300, 302; transistors 304, 306; or transistors 308, 310) provides the required current, to drive the read port capacitance. In addition, since the storage node nin in this configuration is buffered from the output by the inverters, charge sharing is not a problem as in the configuration of FIG. 2.

However, the read port configuration of the register cell 100 of FIG. 3 also has several disadvantages. First, each read port places an additional load on the RAM cell 206 which increases the setup time required to write the RAM cell 206. Second, there are two pulldown transistors (e.g., 300, 302) driving the output load. As a result, in order to minimize the output delay each of the pullup or pulldown transistors (300, 302 or 304, 306 or 308, 310) must be twice as wide as would be necessary if a single pullup or pulldown transistor were used in the absence of transfer gates 216, 218 or 220. This increases the capacitance on both the READ line and on the inverters of the RAM cell 206. The capacitance on the read port is also increased due to the diode and gate overlap capacitances of the larger output transistors. Of course, additional area is also required for the larger transistors.

FIG. 4 illustrates a register cell 100 based on that shown in FIG. 3 except that the read ports are precharged. In this configuration, the PFETs of the buffer inverters are removed since the RAM cell 206 is not required to pull up the precharged output. Instead, the read port need only pull down the output line using transistors 400, 402, or 404 for a low output. During operation, when the READ line (READ1, READ2, READ3) is true and the RAM cell 206 is storing a "0" (nin=1), the read port is discharged. Otherwise, the read port remains precharged. However, this configuration also has many of the same disadvantages recited above with respect to the configuration of FIG. 3.

Another implementation of a multiple read port register file known to the present inventors actually replicates the entire register array once for each read port. This avoids the problems associated with dumping multiple read ports of registers simultaneously but at a tremendous area penalty, for not only is the dump circuit replicated a plurality of times, but the address decoders, RAM cells, sensing amplifiers and write ports are replicated as well.

Accordingly, an improved register file is desired which may support a plurality of read ports for dumping data simultaneously without disturbing the state of the values stored in the RAM cells while also providing a small setup time and maximum speed and using a small chip area. The present invention has been designed to meet these needs.

SUMMARY OF THE INVENTION

The present invention meets the aforementioned needs of the prior art by providing a memory device with a unique dump circuit which allows a plurality of read ports to be dumped simultaneously without disturbing the state of the values stored in the memory cells. A preferred embodiment of the invention is incorporated into a register file used in a floating point data path of a floating point processor of the type described by DeLano et al. and provides the capability of concurrent execution of a floating point multiply, add and a load or store. In the preferred configuration, only one FET is used in the pull down string so as to provide maximum speed and a very small load is placed on the register cell itself so as to allow a small setup time. In addition, since no additional local dump circuits are required, the register cell may be made compact so as to cover a very small area.

A preferred embodiment of a memory device in accordance with the invention comprises a plurality of memory cells for storing data, at least one WRITE port for writing input data values into the plurality of memory cells in response to a WRITE signal, and a plurality of READ ports for dumping data values stored in the plurality of memory cells to output lines corresponding to the plurality of READ ports in response to a READ signal. In the preferred embodiment, each READ port comprises a logic circuit for logically ANDing a value stored in a memory cell to be read with the READ signal and a dump circuit responsive to a logical AND output of the logical circuit for precharging the output line corresponding to the READ ports to a predetermined logic level and dumping the value stored in the memory cell to be read to the output line corresponding to the READ port when the logical AND output is true. Preferably, each READ port is electrically isolated from each other READ port so that the plurality of READ ports may be dumped simultaneously without disturbing the data stored in the plurality of memory cells.

In a preferred configuration, the logic circuit comprises first and second NFETs connected so as to have a common output node, and a gate of the first NFET is responsive to an output of a first cross-coupled inverter of the memory cell so as to connect the READ signal to the common output node when the output of the first inverter is at the predetermined logic level. Also, a gate of the second NFET is preferably responsive to an output of a second cross-coupled inverter of the memory cell so as to connect the common output node to ground when the output of the second inverter is at the predetermined logic level. The dump circuit, on the other hand, preferably comprises a dump transistor having a gate thereof connected to the common output node so as to change a voltage level on the precharged output line corresponding to the READ port only when the common node is at the predetermined logic level.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which.

DETAILED DESCRIPTION OF THE PRESENTLY PREFERRED EXEMPLARY EMBODIMENT

The inventors of the subject matter disclosed and claimed herein have satisfied the above-mentioned needs in the art by developing a memory device which has multiple read ports which may be read simultaneously without affecting the data stored in the memory cells. A register cell designed in accordance with a presently preferred embodiment of the invention will be described below with respect to FIGS. 5 and 6. However, it will be appreciated by those of ordinary skill in the art that the description given herein with respect to those figures is for exemplary purposes only and is not intended in any way to limit the scope of the invention. For example, the invention need not be limited to floating point register files and may include other types of memory devices as well. Accordingly, all questions regarding the scope of the invention should be resolved by referring to the appended claims.

Figure 1:
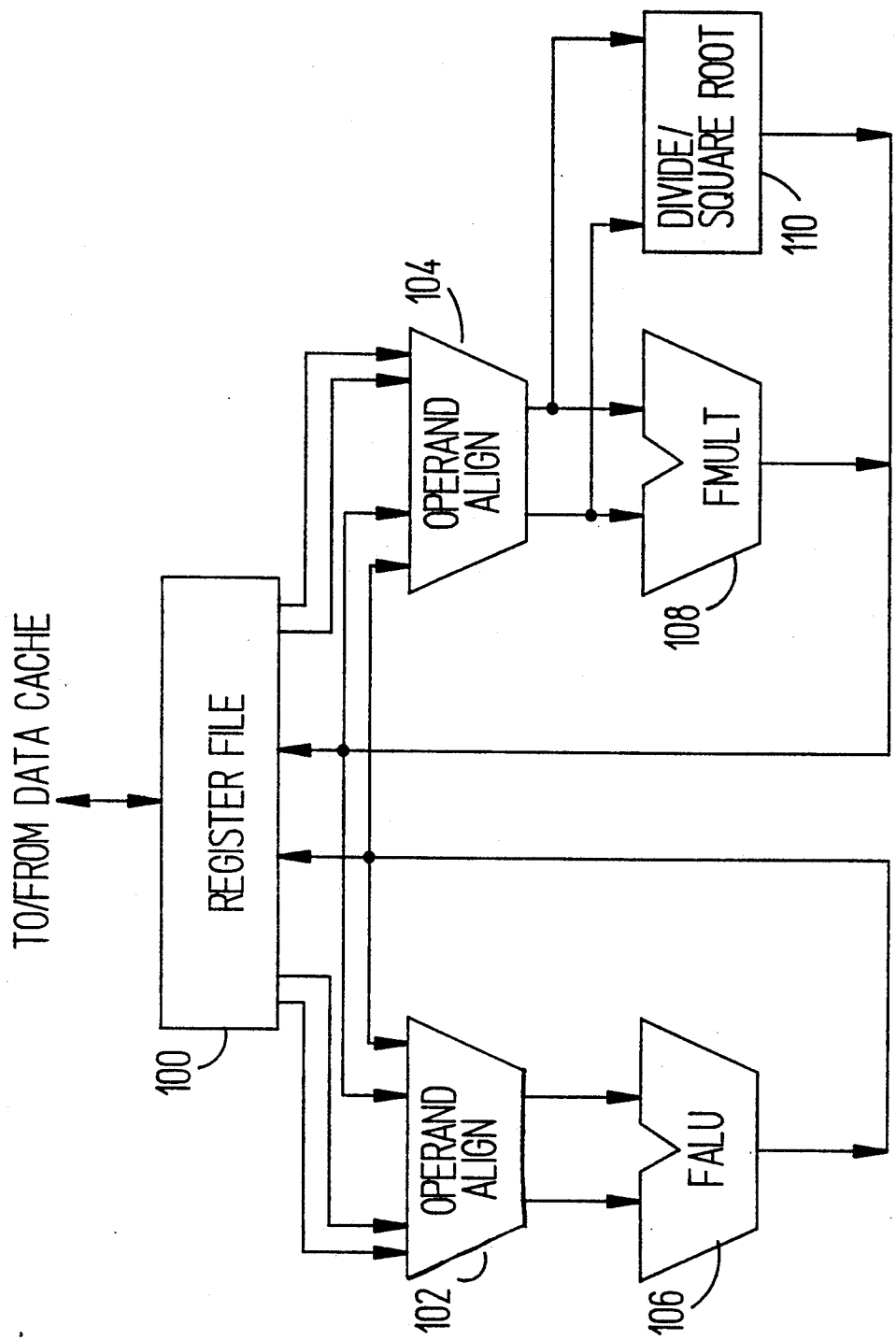
FIG. 1 illustrates a block diagram of a floating point data path of a conventional floating point processor.
Figure 2:
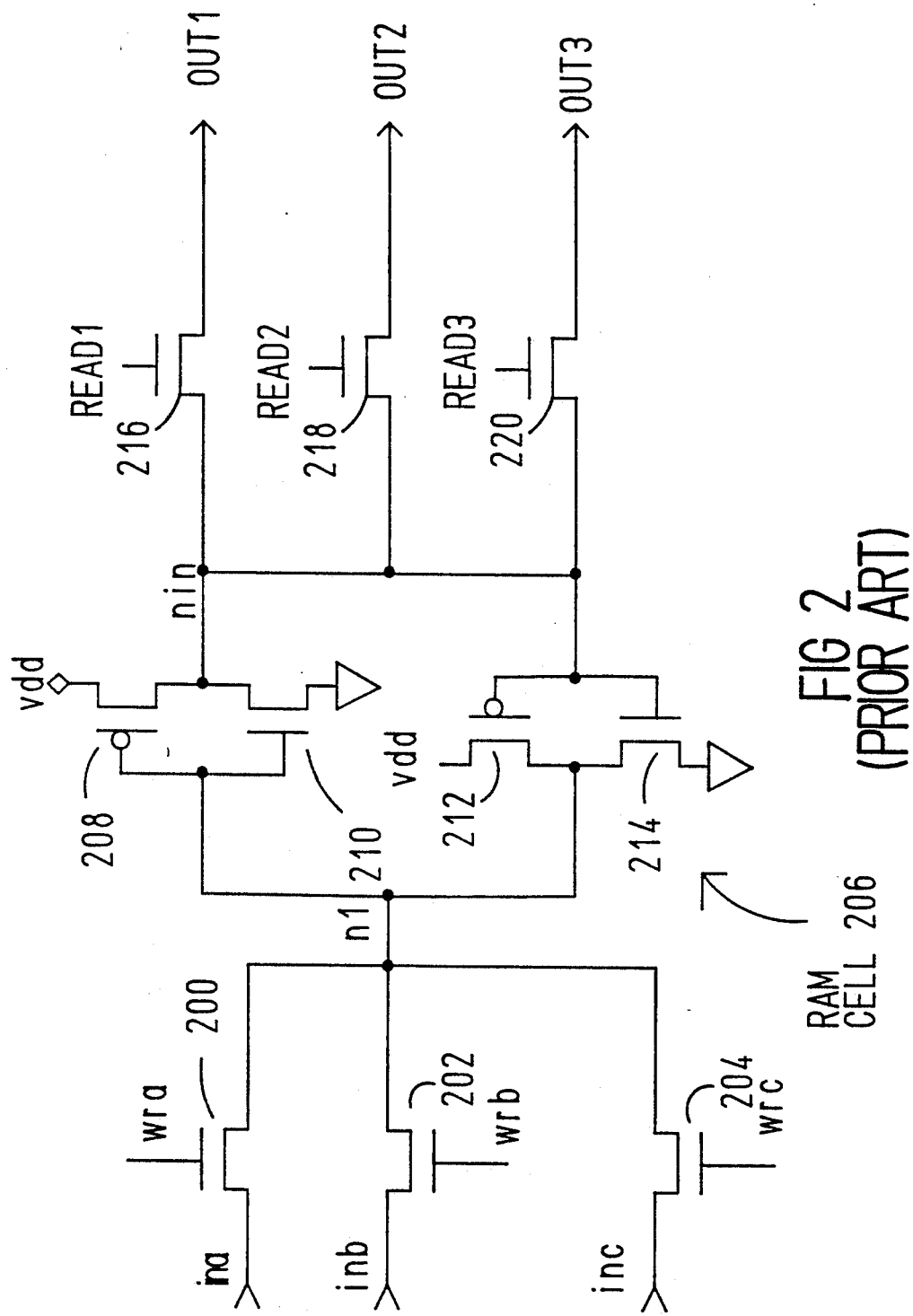
FIG. 2 illustrates a prior art memory device which uses simple transfer gates as the read ports.
Figure 5:
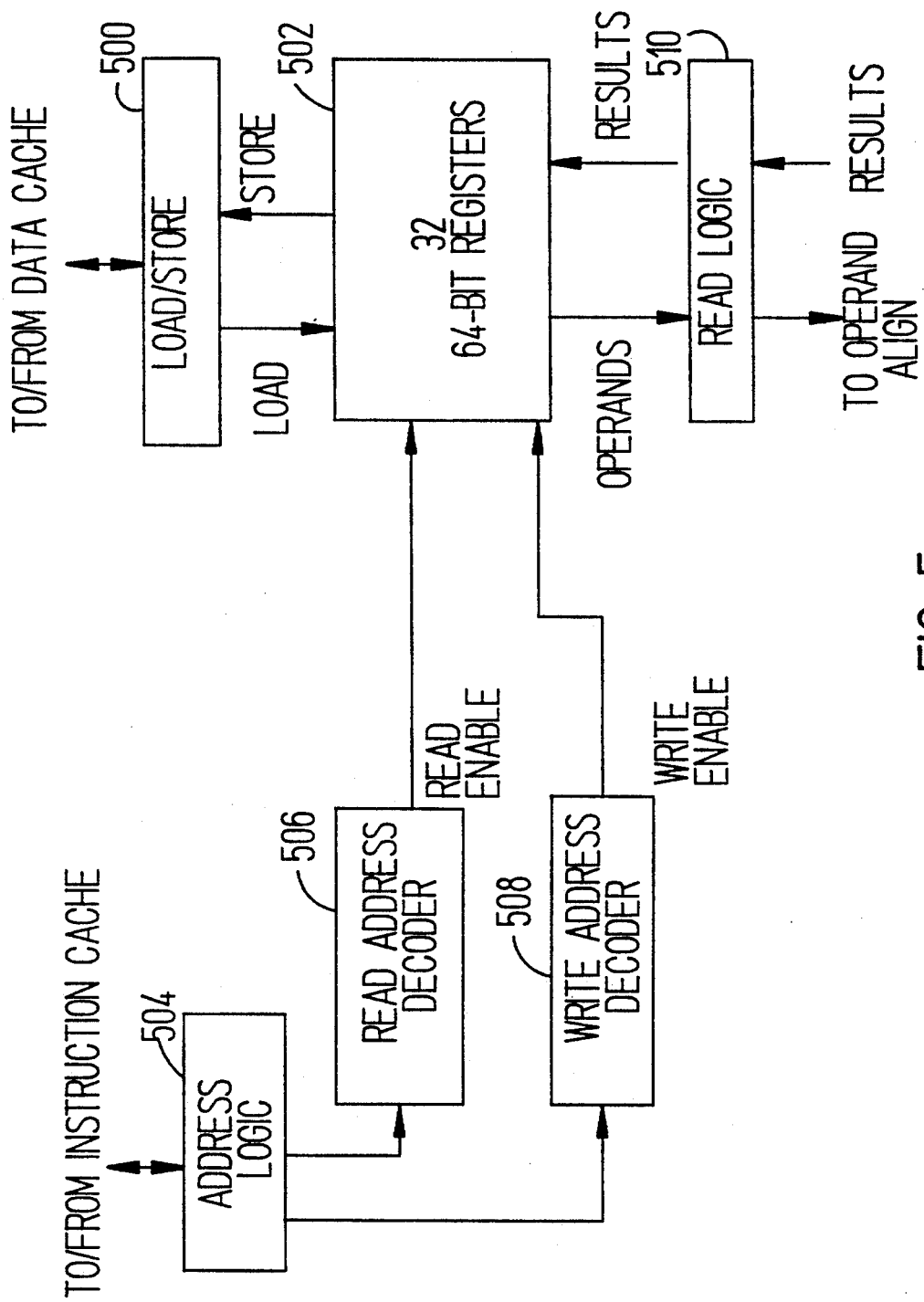
FIG. 5 illustrates an embodiment of a register cell 100 having 64-bit registers embodying read ports designed in accordance with the invention.

FIG. 5 illustrates a sample embodiment of register file 100 for use in a floating point data path of the type illustrated in FIG. 1. As illustrated, the register file 100 of FIG. 5 preferably comprises load/store logic 500 which loads data into respective 64-bit registers of memory cell 502 and includes sensing amplifiers which detect output values from these 64-bit registers which are to be stored into a data cache of the floating point processor. Memory cell 502 may comprise a static RAM (SRAM) or some other memory device well known to those skilled in the art and may use 64-bit registers for double precision operations or 32-bit registers for single precision operations. Address logic 504 receives the address for the data from an instruction cache of the floating point processor and may predecode the address data in accordance with techniques known to those skilled in the art. The read address is then decoded by read address decoder 506 and a read enable signal provided to the appropriate register of memory cell 502. Similarly, the write address is decoded by write address decoder 508 and a write enable signal provided to the appropriate register of memory cell 502. Operands and the like stored in the 64-bit registers of memory cell 502 may then be read out by read logic 510 which may include, for example, sensing amplifiers which detect output values from the memory cell 502 which are to be passed to the floating point processing units. Results of the downstream floating point operations performed by FALU 106 and the like may also be passed back through the read logic 510 for storage in the 64-bit registers of memory cell 502. Those skilled in the art will appreciate that the memory cell 502 may also include registers for storing floating point exception data and the like.

Figure 6:
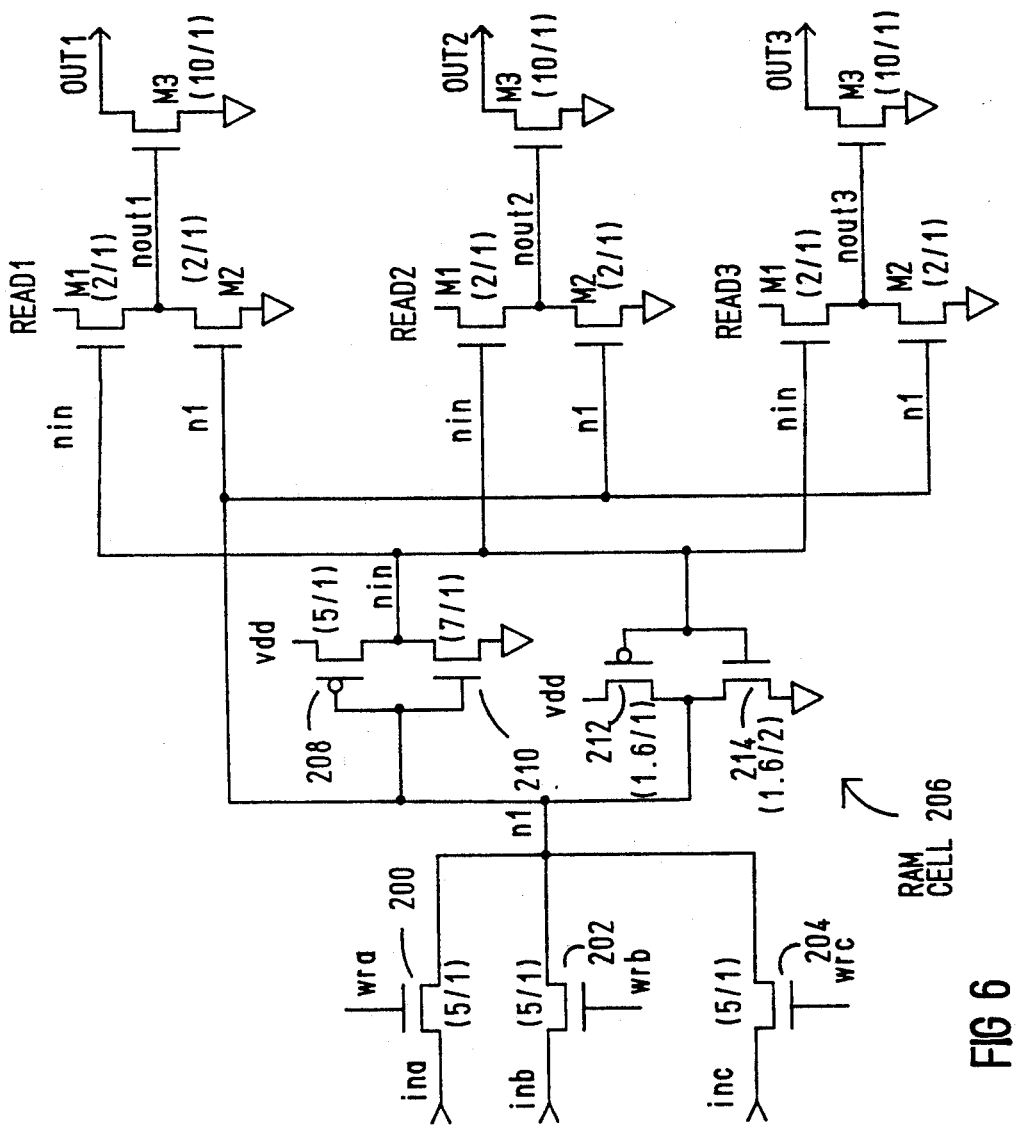
FIG. 6 illustrates a memory device having read ports designed in accordance with a preferred embodiment of the invention.

FIG. 6 illustrates a memory device in accordance with the invention which has been developed as a preferred memory cell 502 which overcomes the above-mentioned problems associated with driving multiple read ports simultaneously. As illustrated, the read ports of FIG. 6 each comprise transistors M1, M2 and M3 for effectively logically ANDING the values stored in the RAM cell 206 (node nin) with the READ signal (READ1, READ2, READ3) and then dumping this value to the output line via transistor M3 when the logical AND output is true. For use in a register cell, the respective transistors of the circuit of FIG. 6 preferably have the width/length ratios indicated, although transistors of other sizes may of course be used. For the illustrated embodiment, when the value stored in the RAM cell 206 is a "1", NIN is low and transistor M1 is OFF while N1 is high so that transistor M2 is ON, thereby pulling the value on the node NOUT to ground. Therefore, the output dump transistor M3 is OFF so that the output port OUT stays precharged independent of the value of the READ line READ1, READ2 or READ3. On the other hand, when the value stored in the RAM cell 206 is a "0", NIN is high and transistor M1 is ON while N1 is low so that transistor M2 is OFF. The value on node NOUT thus goes to a logical "1" when the value on the READ line is true. The read port is then discharged through dump transistor M3 and the output OUT is pulled low. However, if the READ line is false, the value on node NOUT is a "0" and the read port remains precharged.

Essentially, the read port circuit of FIG. 6 performs a logical AND of the value stored in the RAM cell 206 and the corresponding READ line. In other words, if both the READ line and the value in the RAM cell 206 are "1", then the read port is discharged. However, if either the READ line or the value in the RAM cell 206 is "0", then read port remains precharged. In addition, each read port dump circuit (M1, M2, M3) is preferably electrically isolated from each other read port dump circuit so that multiple read ports can be dumped simultaneously with affecting the data stored in the RAM cell 206.

Figure 3:
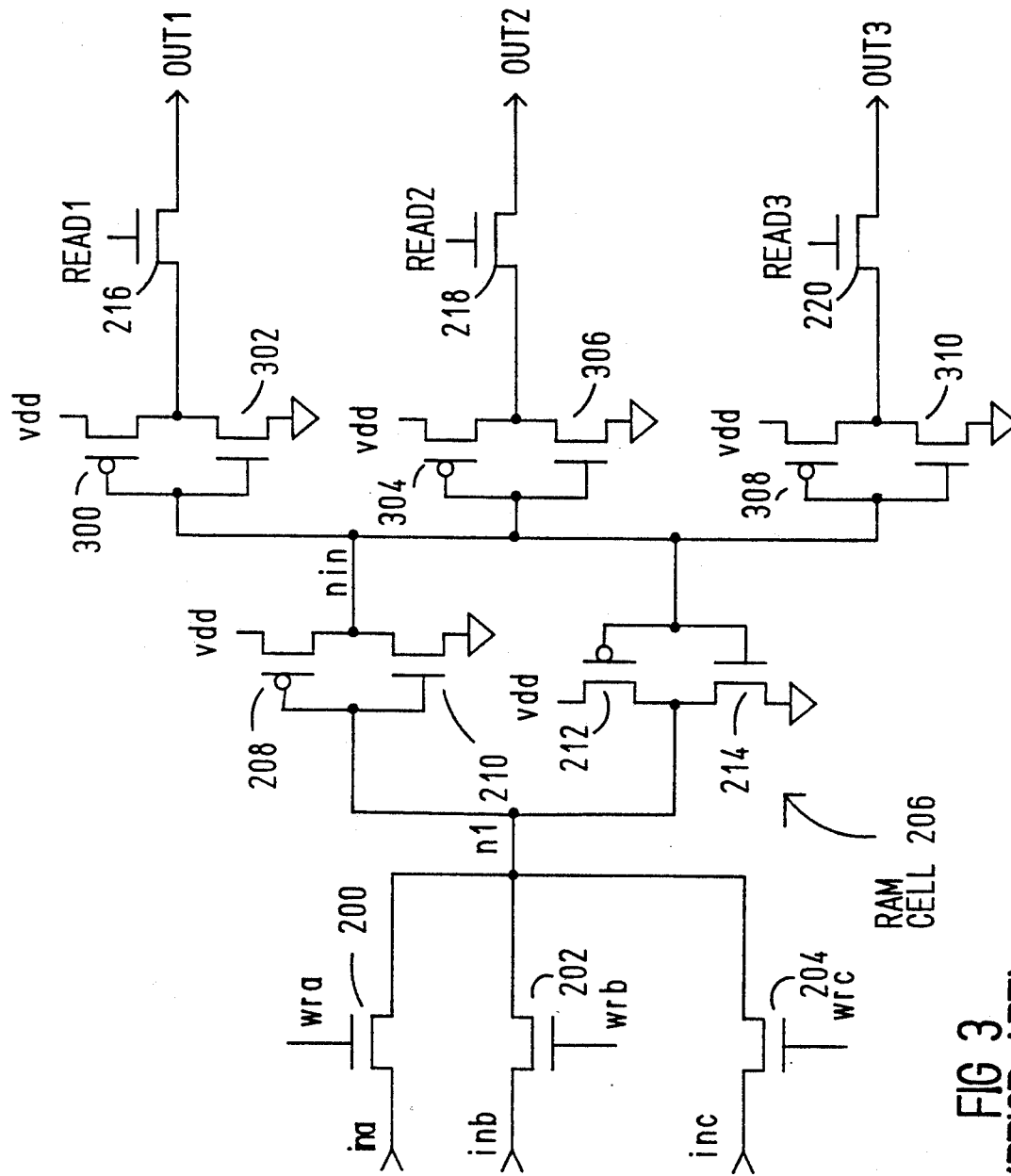
FIG. 3 illustrates a prior art memory device which includes output buffers between the storage cell and the transfer gates of the read ports.
Figure 4:
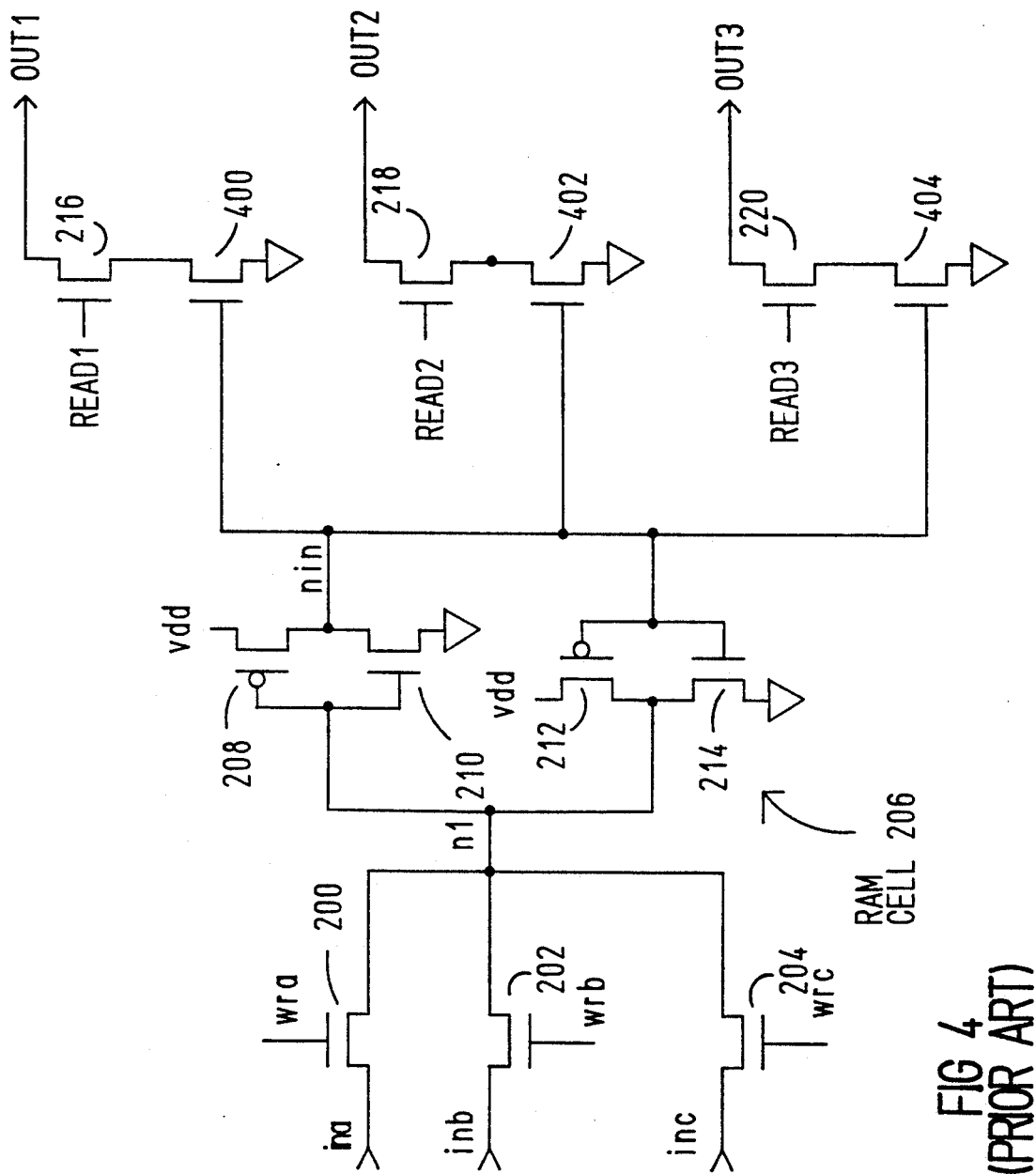
FIG. 4 illustrates a prior art memory device having precharged read ports.

In the circuit of FIG. 6, since there is only one transistor in the read port discharge path, the dump circuit (M1, M2, M3) may be very small so as to reduce the area required for the dump circuit. Moreover, the pull-down transistor M3 may be made roughly half the size (width/length) of each of the pull down FETs in the prior art circuit of FIG. 4, thereby requiring only ¼ the chip area. This reduces the parasitic diode and gate overlap capacitances on the read port. Also, this minimizes the capacitance on node NOUT, which in turn reduces the capacitance seen by the READ line through transistor M1. In addition to reducing the area required for the RAM cell 206, this also improves the speed and reduces the power required to operate the read port dump circuit. Moreover, unlike the prior art circuit illustrated in FIG. 3, in which the read port discharge transistor places a capacitive load on the RAM cell 206, the RAM cell 206 in accordance with the present invention is loaded only by relatively small transistors M1 and M2. Since transistors M1 and M2 may be made very small in accordance with the present invention, the impact of the dump circuit on the write setup time may be minimized.

Upon quick examination of the read port circuit of FIG. 6, one skilled in the art may suspect that the speed of the dump circuit is hindered by the fact that node NOUT is driven high through an n-only transfer gate M1 and thus the gate of the pulldown transistor M3 is driven to a logic "1" level of $V_{DD}$-VT(n), where VT(n) is determined for transistor M1. However, this is not a problem in accordance with the present invention since the output OUT on the output line can be pulled down enough to trip a sensing amplifier before the READ signal READ1, READ2 or READ3 reaches $V_{DD}$-VT(n). Thus, driving node NOUT through an n-only transfer gate does not seriously affect the speed of the circuit and results in a structure which is much more compact than if a full complementary transfer gate were used. On the other hand, one skilled in the art may use a PFET to pull node NOUT all the way up to $V_{DD}$ rather than $V_{DD}$-VT(n). However, such a configuration has its obvious area penalties.

Those skilled in the art will also appreciate that the more read ports added to the register file the greater the capacitive load on the RAM cell 206 and the greater the effect on setup time. However, when designed as herein described, the present invention places less load on the RAM cell 206 and hence impacts the setup time less than for conventional read ports. For example, five read ports have been used in the embodiment of FIG. 6 without adversely affecting setup time. On the other hand, should capacitive load remain a problem, one skilled in the art will appreciate that buffers may be added as in the embodiment of FIG. 3 to minimize the effect of the capacitive load on the value stored in the RAM cell 206.

Although an exemplary embodiment of the invention has been described in detail above, those skilled in the art will readily appreciate that many additional modifications are possible in the exemplary embodiment without materially departing from the novel teachings and advantages of the invention. For example, while the present invention has been described with respect to a register cell having only single-ended outputs, those skilled in the art will appreciate that the read ports of the memory device of the invention may be easily extended to double-ended outputs by, for example, differentially sensing the two outputs to determine the state of the memory cell. However, for a large number of read ports, the number of metal busses required for double-ended outputs may become prohibitive and hence is not presently preferred. But as metal processes improve (reduced pitch, larger number of metal layers, and the like), double-ended multiple read ports may become more desirable. Accordingly, all such modifications are intended to be included within the scope of this invention as defined in the following claims.

We claim:

1. A memory device comprising:
   a plurality of memory cells for storing data;
   at least one WRITE port for writing input data values into said plurality of memory cells in response to a WRITE signal; and
   a plurality of READ ports for dumping data values stored in said plurality of memory cells to output lines corresponding to said plurality of READ ports in response to a READ signal, each READ port comprising a logic circuit for logically AND-ing a value stored in a memory cell to be read with said READ signal and a dump circuit responsive to a logical AND output of said logic circuit for pre-charging the output line corresponding to said READ port to a predetermined logic level and dumping said value stored in the memory cell to be read to the output line corresponding to said READ port when said logical AND output is true.

2. A memory device as in claim 1, wherein each of said memory cells comprises a first inverter for inverting input data at an input thereof and a second inverter cross coupled with said first inverter, and wherein each said logic circuit comprises first and second NFETs connected so as to have a common output node, a gate of said first NFET being responsive to an output of said first inverter so as to connect said READ signal to said common output node when said output of said first inverter is at said predetermined logic level, and a gate of said second NFET being responsive to an output of said second inverter so as to connect said common output node to ground when said output of said second inverter is at said predetermined logic level.

3. A memory device as in claim 2, wherein said dump circuit comprises a dump transistor having a gate thereof connected to said common output node so as to change a voltage level on said precharged output line corresponding to said READ port only when said common output node is at said predetermined logic level.

4. A memory device as in claim 1, wherein each READ port is electrically isolated from each other READ port so that said plurality of READ ports may be dumped simultaneously without disturbing said data stored in said plurality of memory cells.

* * * * *